(12) United States Patent
Baik

(10) Patent No.: US 7,826,273 B2
(45) Date of Patent: Nov. 2, 2010

(54) METHOD OF VERIFYING PROGRAMMING OF A NONVOLATILE MEMORY DEVICE

(75) Inventor: Seung Hwan Baik, Gyeonggi-do (KR)

(73) Assignee: Hynix Semiconductor Inc., Icheon-si (KR)

( * ) Notice: Subject to any disclaimer, the term of this patent is extended or adjusted under 35 U.S.C. 154(b) by 147 days.

(21) Appl. No.: 12/324,713

(22) Filed: Nov. 26, 2008

(65) Prior Publication Data

US 2009/0141556 A1 Jun. 4, 2009

(30) Foreign Application Priority Data

Nov. 29, 2007 (KR) .................. 10-2007-0122632

(51) Int. Cl.
*G11C 11/34* (2006.01)
(52) U.S. Cl. .................. 365/185.22; 365/203
(58) Field of Classification Search ............ 365/185.22, 365/203
See application file for complete search history.

(56) References Cited

U.S. PATENT DOCUMENTS 5,521,864 A * 5/1996 Kobayashi et al. ..... 365/185.22

FOREIGN PATENT DOCUMENTS

| KR | 1020060070734 A | 6/2006 |
| KR | 1020070103199 A | 10/2007 |

* cited by examiner

*Primary Examiner*—Son Dinh
*Assistant Examiner*—Nam Nguyen
(74) *Attorney, Agent, or Firm*—Townsend and Townsend and Crew LLP (57) ABSTRACT

A first verify voltage is applied to a word line of a selected memory cell, after a bit line is precharged, to program-verify the memory cell in a nonvolatile memory device. A first read evaluation operation for changing a voltage of the bit line is performed. Results of the first read evaluation operation are sensed using a first sensing voltage. A second read evaluation operation for changing the voltage of the bit line is performed again. Results of the second read verify operation are then sensed using the first sensing voltage.

18 Claims, 8 Drawing Sheets

FIG. 5

METHOD OF VERIFYING PROGRAMMING OF A NONVOLATILE MEMORY DEVICE

CROSS-REFERENCES TO RELATED APPLICATION

The present application claims priority to Korean patent application number 10-2007-0122632, filed on Nov. 29, 2007, which is incorporated by reference in its entirety.

BACKGROUND OF THE INVENTION

The present invention relates to an operation of a nonvolatile memory device and, more particularly, to a method of verifying programming of a nonvolatile memory device using a double verify method.

A semiconductor memory device is a memory device in which data can be stored and from which stored data can be read. Semiconductor memory devices include volatile memory, which loses its stored data when power is off, and nonvolatile memory, which can retain its stored data although power is off. Flash memory of the nonvolatile memories electrically erases data of cells as a group and is widely used in computers, memory cards, etc.

Flash memory is categorized into a NOR type and a NAND type according to the connection status of cells and bit lines. NOR type flash memory has a structure in which two or more cell transistors are connected in parallel to one bit line. NOR type flash memory is configured to store data using the channel hot electron scheme and erase data using the Fowler-Nordheim (F-N) tunneling scheme. NAND type flash memory has a structure in which two or more cell transistors are connected in series to one bit line. NAND type flash memory is configured to store and erase data using the F-N tunneling scheme. In general, NOR type flash memory is disadvantageous for high integration because of large current consumption, but is advantageous for high speed. NAND type flash memory is advantageous for high integration because it uses a cell current lower than that of NOR type flash memory.

A method of programming a nonvolatile memory device includes an incremental step pulse programming (ISPP) scheme. In the ISPP scheme, after applying a program pulse, a program voltage is only applied to memory cells having a threshold voltage level lower than a verify voltage level, while increasing the program voltage by a certain step. Memory cells having threshold voltage distributions higher than the verify voltage level are program-inhibited.

If a lower step voltage is set with respect to memory cells having a specific program speed, the width of threshold voltage distributions can be narrowed. However, if the step voltage is set to a low level, the program time increases. In contrast, if the step voltage is set to a high level, the program time decreases, but the width of threshold voltage distributions of memory cells is increased.

When verifying programming in a nonvolatile memory device, a variety of methods of narrowly forming threshold voltage distributions of memory cells have been proposed.

BRIEF SUMMARY OF THE INVENTION

The present invention is directed towards a method of verifying programming of a nonvolatile memory device. Embodiments of the invention precharge a bit line only once when a program verify operation is performed twice.

According to an aspect of the present invention, a method of verifying programming of a selected memory cell of a nonvolatile memory device is disclosed. The method includes: a first sensing step of, after a bit line is precharged, applying a first verify voltage to a word line of the selected memory cell, performing a first read evaluation operation for changing a voltage of the bit line, and sensing results of the first read evaluation operation using a first sensing voltage; and a second sensing step of, after the first sensing step, performing a second read evaluation operation for changing the voltage of the bit line, and sensing results of the second read evaluation operation using the first sensing voltage.

A pass voltage is applied to the remaining word lines other than the word line of the selected memory cell.

In the second read evaluation operation, the first verify voltage is applied to the word line of the selected memory cell.

A step voltage of a program voltage with respect to memory cells, which are sensed as program fail in the first sensing step, is set to a first step voltage level.

A step voltage of a program voltage with respect to memory cells, which are sensed as program pass in the first sensing step and sensed as program fail in the second sensing step, is set to a second step voltage level.

A step voltage of a program voltage with respect to memory cells, which are sensed as program fail in the first sensing step, is set to a first step voltage level higher than a current program step voltage level. A step voltage of a program voltage with respect to memory cells, which are sensed as program pass in the first sensing step and sensed as program fail in the second sensing step, is set to a second step voltage level lower than a current program step voltage level.

According to another aspect of the present invention, a method of verifying programming of a memory cell of a nonvolatile memory device is disclosed. The method includes: after a bit line is precharged, applying a first verify voltage to a word line of the selected memory cell and performing a read evaluation operation for changing a voltage of the bit line; and sensing results of the read evaluation operation using a first sensing voltage and a second sensing voltage.

A pass voltage is applied to the remaining word lines other than the word line of the selected memory cell.

A step voltage of a program voltage with respect to memory cells, which are sensed as program fail as a result of the sensing using the first sensing voltage, is set to a first step voltage level.

A step voltage of a program voltage with respect to memory cells, which are sensed as program pass as a result of the sensing using the first sensing voltage and sensed as program fail as a result of the sensing using the second sensing voltage, is set to a second step voltage level.

A step voltage of a program voltage with respect to memory cells, which are sensed as program fail as a result of the sensing using the first sensing voltage, is set to a first step voltage level higher than a current program step voltage level. A step voltage of a program voltage with respect to memory cells, which are sensed as program pass as a result of the sensing using the first sensing voltage and sensed as program fail as a result of the sensing using the second sensing voltage, is set to a second step voltage level lower than a current program step voltage level.

The sensing of the results of the read evaluation operation using the first and second sensing voltages includes a first sensing step of sensing the results of the read evaluation operation using the first sensing voltage; and a second sensing step of performing a second read evaluation operation for changing the voltage of the bit line, and sensing results of the second read evaluation operation using the second sensing voltage.

DESCRIPTION OF SPECIFIC EMBODIMENTS

Hereinafter, the present invention will be described in detail in connection with specific embodiments with reference to the accompanying drawings. The present embodiments are provided to complete the disclosure of the present invention and to allow those having ordinary skill in the art to understand the scope of the present invention.

Figure 1A:
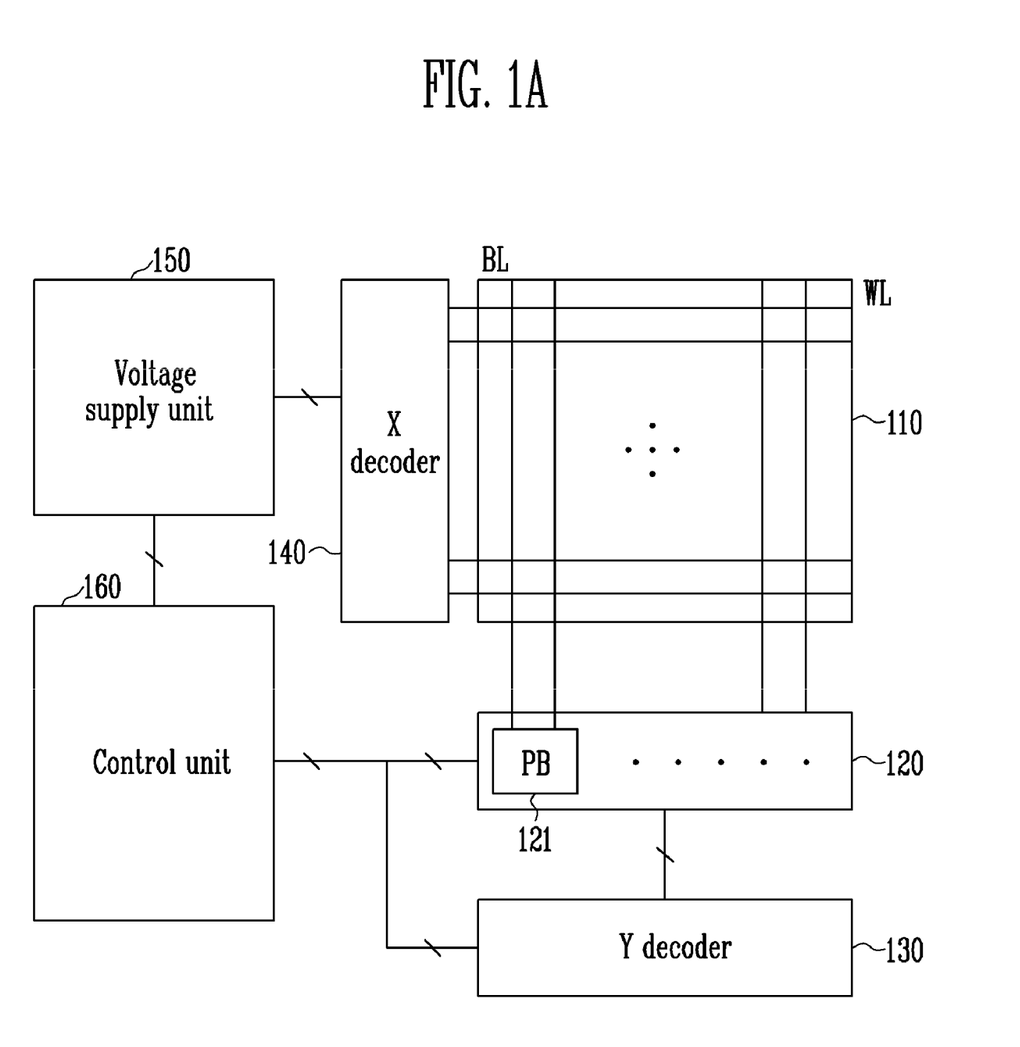
FIG. 1A is a block diagram showing the configuration of a flash memory device.

FIG. 1A is a block diagram showing the configuration of a flash memory device.

Referring to FIG. 1A, a flash memory device 100 includes a memory cell array 110, a page buffer unit 120, a Y decoder 130, an X decoder 140, a voltage supply unit 150, and a control unit 160.

The memory cell array 110 includes memory cells for storing data, which are constructed with word lines WL and bit lines BL. The page buffer unit 120 includes a plurality of page buffers PB connected to the bit lines of the memory cell array 110.

The Y decoder 130 offers a data input/output path to the page buffers of the page buffer unit 120 in response to a control signal of the control unit 160. The X decoder 150 selects the word lines of the memory cell array 110 in response to a control signal of the control unit 160.

The voltage supply unit 150 generates operating voltages under the control of the control unit 160 and supplies the generated operating voltages to the word lines of the memory cell array 110 or the page buffers through the X decoder 140. The voltage supply unit 150 generates and supplies program voltages as a start voltage and a set step voltage using the ISPP scheme. The start voltage and the step voltage may be varied by the control unit 160.

The control unit 160 controls the memory cell array 110, the page buffer unit 120, the Y decoder 130, the X decoder 150, and the voltage supply unit 150.

Figure 1B:
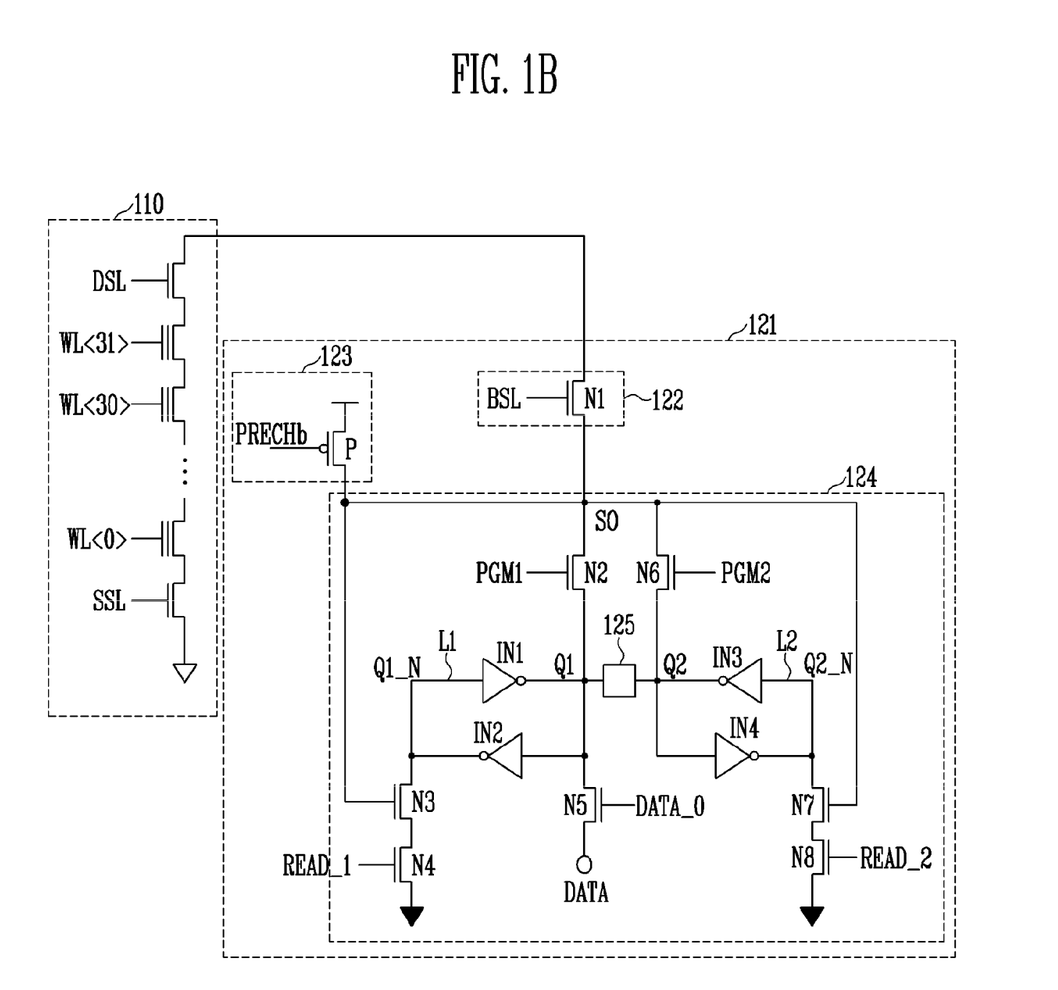
FIG. 1B is a partial circuit diagram of a page buffer shown in FIG. 1A.

FIG. 1B is a partial circuit diagram of the page buffer shown in FIG. 1A.

Referring to FIG. 1B, each of the plurality of page buffers 121 included in the page buffer unit 120 includes a bit line select unit 122, a precharge unit 123, a latch unit 124, and a verify unit 125.

The bit line select unit 122 connects a bit line connected to a memory cell string of the memory cell array 110 and a sensing node SO in response to a control signal of the control unit 160. The bit line select unit 122 can control the bit line precharge by changing the voltage level of the control signal. A bit line select unit connects one of a pair of bit lines, comprising an even bit line and an odd bit line, and the sensing node SO in response to the control signal. In FIG. 1B, only a portion connected to one bit line is shown.

The precharge unit 123 precharges the sensing node SO. The latch unit 124 stores data to be programmed into a memory cell and transfers the data through the sensing node SO. The latch unit 124 also reads data stored in a memory cell through the sensing node SO, stores the read data and then outputs the data.

The verify unit 125 determines whether programming of a selected memory cell has been completed based on the state of data latched in the latch unit 124 and outputs a verify signal.

The bit line select unit 122 includes a first NMOS transistor N1, and the precharge unit 123 includes a PMOS transistor P. The latch unit 124 includes second to eighth NMOS transistors N2 to N8 and first to fourth inverters IN1 to IN4.

The first NMOS transistor N1 of the bit line select unit 122 is connected between a bit line and the sensing node SO and operates in response to a bit line select signal BSL.

The PMOS transistor P operates in response to a precharge control signal PRECHb in order to apply a power source voltage to the sensing node SO. The second NMOS transistor N2 is connected between the sensing node SO and a node Q1 and has a gate to which a first program signal PGM1 is input.

The third and fourth NMOS transistors N3 and N4 are connected in series between a node Q1_N and a ground node. A gate of the third NMOS transistor N3 is connected to the sensing node SO, and a first read signal READ_1 is input to a gate of the fourth NMOS transistor N4.

The fifth NMOS transistor N5 is connected between the node Q1 and a data output node DATA, and has a gate to which a data output signal DATA_O is input. The first and second inverters IN1, IN2 constitute a first latch L1 and are connected between the node Q1 and the node Q1_N.

The sixth NMOS transistor N6 is connected between the sensing node SO and a node Q2, and has a gate to which a second program signal PGM2 is input. The seventh and eighth NMOS transistors N7, N8 are connected in series between a node Q2_N and a ground node. A gate of the seventh NMOS transistor N7 is connected to the sensing node SO. A second read signal READ_2 is input to a gate of the eighth NMOS transistor N8.

The third and fourth inverters IN3, IN4 constitute a second latch L2 and are connected between the node Q2 and the node Q2_N.

The memory cell array 110 includes a plurality of bit lines, and the respective bit lines are connected to memory cell strings.

Each of the memory cell strings includes a drain select transistor, a source select transistor, and a plurality of memory cells connected in series between the drain select transistor and the source select transistor. The bit line is connected to a drain terminal of the drain select transistor.

The word lines WL are connected to the gates of memory cells of the memory cell string. A drain select signal is input to the gate of the drain select transistor. A source select signal is input to the gate of the source select transistor.

A flash memory device employs a double verify method in order to decrease the width of threshold voltage distributions of memory cells.

A double verify method is described below with reference to the page buffer 121 of FIG. 1B.

For the purpose of verification after performing programming on a selected memory cell using a program pulse, the sensing node SO is precharged to a power source voltage level by the precharge unit 123. A bit line is then precharged by applying the bit line select signal BSL having a first voltage V1.

After the bit line is precharged, the drain select transistor and the source select transistor are turned on by applying the drain select signal DSL and the source select signal SSL of a high level. For a first program verify operation, a first verify voltage is applied to a word line of a selected memory cell, and a pass voltage is applied to the remaining word lines.

When the drain select transistor and the source select transistor are turned on, an evaluation period for changing a bit line voltage according to a program state of the memory cell is provided. During the evaluation period, the bit line select signal BSL is applied as a voltage level of 0V in order to turn off the first NMOS transistor N1.

If the selected memory cell has been programmed, the threshold voltage of the memory cell is higher than the first verify voltage. Thus, the memory cell remains turned off, and the voltage of the bit line maintains a precharge voltage.

However, if the selected memory cell has not been programmed, the threshold voltage of the memory cell is lower than the first verify voltage. Accordingly, the memory cell is turned on, and the voltage precharged by the bit line is discharged through the source select transistor.

After the evaluation period, the bit line select signal BSL having a second voltage (V2) level is applied. The result is read from the node Q2 of the second latch L2 of the latch unit 124.

Next, the voltage precharged by the bit line is discharged. After data of the page buffer is reset, a second program verify operation is performed. The second program verify operation is the same as the first program verify operation in the precharging of a bit line, an evaluation period, a read operation, etc. However, the second program verify operation differs from the first program verify operation in that a second verify voltage higher than the first verify voltage is applied to a word line of a selected memory cell.

The double verify method is performed by classifying memory cells for program into three types according to their program speeds and applying different program methods to the respective types. In this method, memory cells are classified into cells programmed at a fast rate, cells programmed at an intermediate rate, and cells programmed at a slow rate, and program voltages applied to the three types of cells are controlled.

As a result of the double verify method, when the memory cells are programmed at the fast rate, they are program-inhibited so that a subsequent program operation is prevented. When the memory cells are programmed at the intermediate rate, a subsequent program operation is performed on the cells using a voltage step lower than the current ISPP step voltage. When the memory cells are programmed at the slow rate, a subsequent program operation is performed on the cells using a voltage step higher than the current ISPP step voltage.

Figure 2:
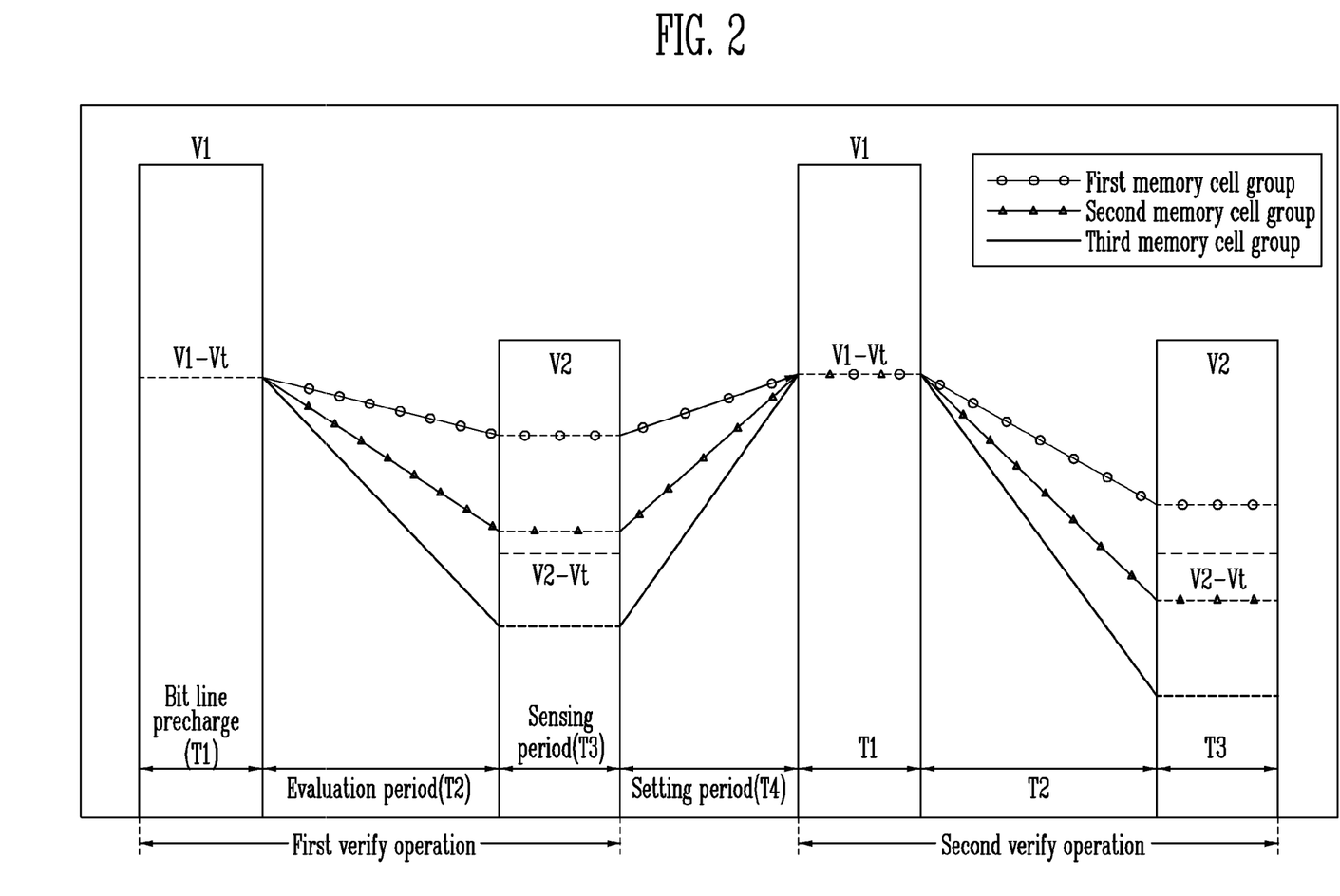
FIG. 2 is a timing diagram showing a double verify method.

FIG. 2 is a timing diagram showing the double verify method.

Referring to FIG. 2, while a program operation is performed, a change in the voltage of a first memory cell group programmed at a fast rate, a second memory cell group programmed at an intermediate rate, and a third memory cell group programmed at a slow rate differs according to a program speed.

In the double verify method, a first verify operation includes the period T1 for precharging a bit line by applying the bit line select signal BSL having a first voltage V1, an evaluation period T2, and a sensing period T3. In the evaluation period T2, a degree to which the voltage of the bit line changes differs in the first to third memory cell groups. This is because a number of memory cells that are turned on differs according to threshold voltages of the respective memory cells, and the amount of current flowing differs accordingly.

After the first verify operation is completed, a setting period T4 is provided for discharging the bit line and setting the latch unit 124. A second verify operation is then performed. The second verify operation is performed for the same time period as the first verify operation.

Accordingly, when the double verify method is used, the bit line precharge period and the evaluation period, which are necessary for each verify operation, lengthen a total verify period, thereby increasing overall programming time.

Accordingly, a new double verify method is proposed according to embodiments of the present invention.

Figure 3A:
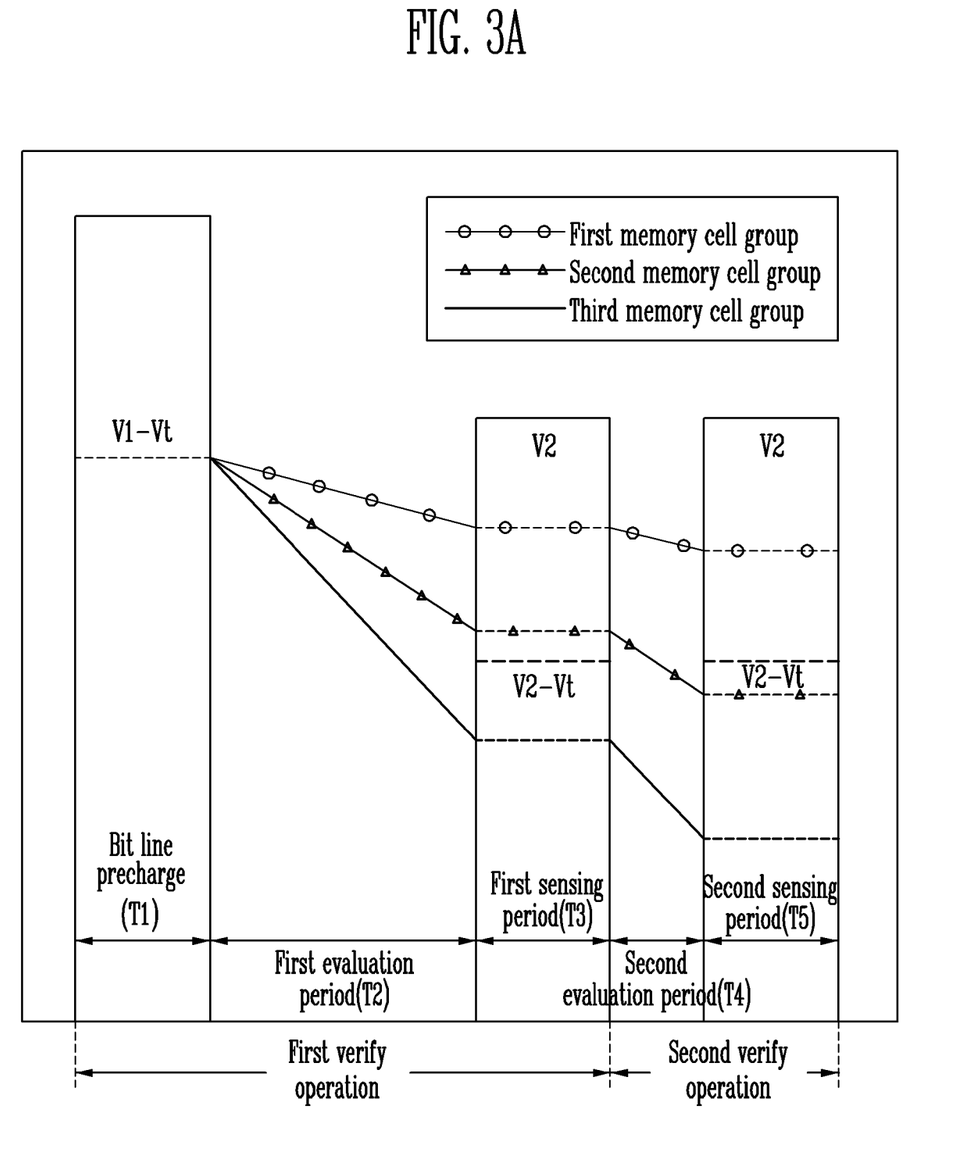
FIG. 3A is an operation timing diagram showing a double verify method according to a first embodiment of the present invention.

FIG. 3A is an operation timing diagram showing a double verify method according to a first embodiment of the present invention.

Referring to FIG. 3A, in a first embodiment of the present invention, when a double verify method is performed, a bit line is precharged only once for both first and second verify operations. After the first verify operation is performed, the second verify operation is performed without discharging and precharging the bit line. When a read verify operation is performed, only a first verify voltage PV1 is applied to a word line on which a program verify operation will be performed.

The double verify method according to the first embodiment is described below in conjunction with the operation of the page buffer 121 shown in FIG. 1B. First, during a precharge period T1, the bit line select signal BSL having a first voltage (V1) level is applied to precharge a bit line. During the precharge period, the bit line is precharged to voltage (V1-Vt). The voltage Vt is the threshold voltage of the first NMOS transistor N1.

After the precharge period, a first evaluation period T2 for a first verify operation is provided. The first NMOS transistor N1 is turned off by applying a bit line select signal BSL of 0V. A first verify voltage PV1 is applied to a word line on which a program operation is being performed, and a pass voltage is applied to the remaining word lines.

A drain select transistor and a source select transistor are turned on by applying a drain select signal and a source select signal of a high level, respectively. Thus, the bit line voltage is evaluated depending on whether a memory cell is programmed.

After the first evaluation period T2, a first sensing period T3 is provided. In the first sensing period T3, the bit line select signal BSL having a second voltage V2 is input. Accordingly, when a voltage of the bit line is higher than a third voltage (V2-Vt) in which the threshold voltage of the first NMOS transistor N1 is subtracted from the second voltage V2, the first NMOS transistor N1 is turned off. However, when the bit line voltage is lower than the third voltage (V2-Vt), the first NMOS transistor N1 is turned on.

During the first sensing period T3, the sensing node SO of the page buffer 121 has been precharged to a high level. Thus, the potential of the sensing node is not discharged, but maintains a floating state.

In the first verify operation, results in which respective memory cell groups are sensed during the first sensing period T3 are shown in FIG. 3A. Since a first memory cell group and a second memory cell group have a threshold voltage higher than the first verify voltage, the rate at which the bit line voltage is discharged is slow. Accordingly, the bit line voltage of the first and second memory cell groups is higher than the third voltage (V2-Vt). The third memory cell group has a threshold voltage lower than the first verify voltage. Accordingly, a bit line voltage of the third memory cell group is lower the third voltage (V2-Vt).

As described above, when the first and second memory cell groups have respective bit line voltages, the first NMOS transistor N1 of the page buffer 121 of the first and second memory cell groups remains turned-off. Accordingly, the sensing node SO maintains the high level without change.

However, the first NMOS transistor N1 of the page buffer 121 of the third memory cell group is turned on. When the first NMOS transistor N1 is turned on, the voltage precharged to the sensing node SO at a high level is combined with a low voltage of the bit line and therefore shifts to a low level.

If the second read signal READ_2 of a high level is applied to the page buffer 121, data of the sensing node SO is loaded onto the second latch L2. A determination is made whether a program operation has passed or failed according to data loaded onto the second latch L2 through the sensing node SO. The determination may be performed by a verify signal output from the verify unit 125.

At the first verify voltage, it is determined that a program operation on the first and second memory cell groups has not passed, so that data is loaded onto the second latch L2, and a program operation on the third memory cell group has passed, so that data is loaded onto the second latch L2.

Accordingly, in the first verify operation, the third memory cell group can be distinguished.

Subsequently, the second verify operation is performed. A second evaluation period T4 is given without precharging the bit line. The first verify voltage PV1 is applied to a selected word line as in the first verify operation.

A second verify voltage PV2 has a voltage level higher than the first verify voltage PV1. Accordingly, a voltage of a bit line that has been discharged to some extent is further discharged. As shown in FIG. 3A, a bit line voltage of the first memory cell group is discharged to a voltage level higher than the third voltage (V2-Vt), and bit line voltages of the second and third memory cell groups are discharged to voltage levels lower than the third voltage (V2-Vt).

Therefore, in a second sensing period T5, the first NMOS transistor N1 of the page buffer 121 connected to the bit line of the first memory cell group remains turned-on, and the first NMOS transistor N1 of the page buffer 121 connected to the bit line of each of the second and third memory cell groups are turned on.

Accordingly, in the second verify operation, the first memory cell group can be distinguished from the second memory cell group. Consequently, a program verify operation can be performed by distinguishing the first to third memory cell groups through the first and second verify operations.

In the double verify method according to the first embodiment, after a bit line is precharged, the bit line select signal BSL having the second voltage (V2) level is equally applied both in the first and second verify operations.

Figure 3B:
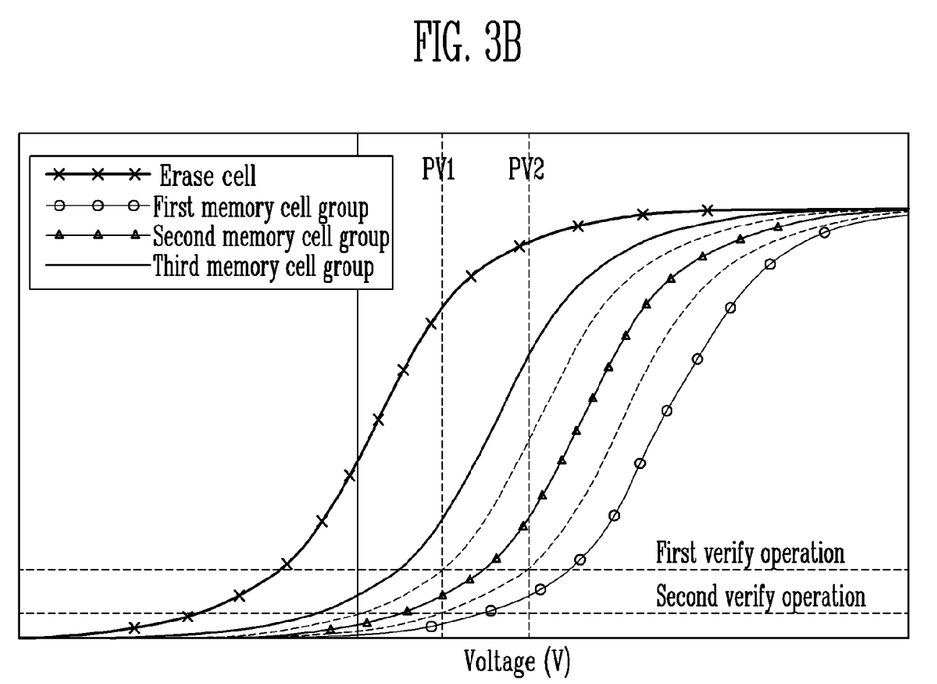
FIG. 3B shows threshold voltage distributions of memory cells when the double verify method of FIG. 3A is performed.

FIG. 3B shows threshold voltage distributions of memory cells when the double verify method of FIG. 3A is performed.

From FIG. 3B, it can be seen that the third memory cell group can be distinguished by performing the first and second verify operations at the first verify voltage PV1, and the second memory cell group can be distinguished.

Unlike the first embodiment, in a sensing operation, the double verify method can be performed by applying the bit line select signal BSL of a different voltage level in the first verify operation and the second verify operation.

Figure 4A:
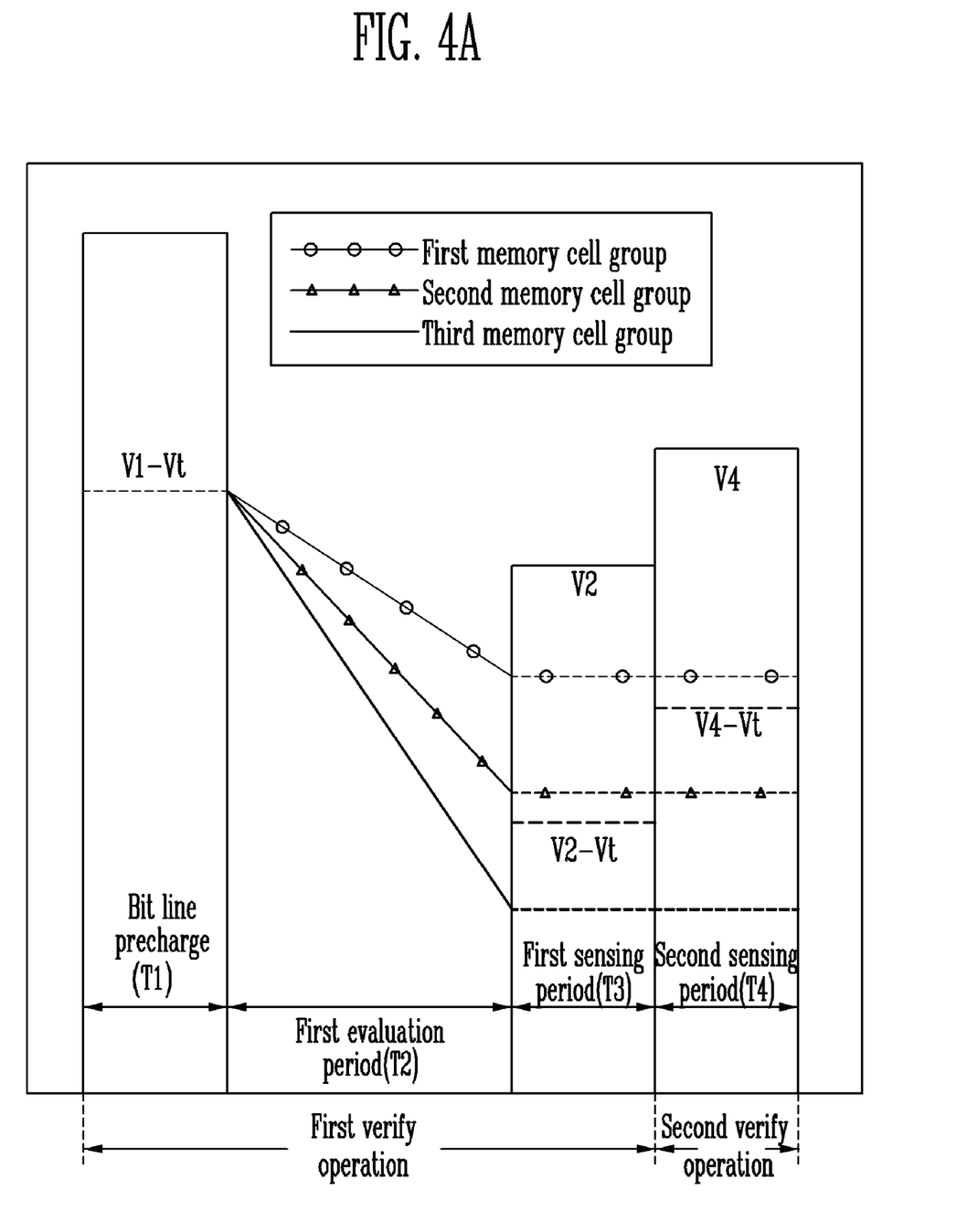
FIG. 4A is an operation timing diagram showing a double verify method according to a second embodiment of the present invention.

FIG. 4A is an operation timing diagram showing a double verify method according to a second embodiment of the present invention.

Referring to FIG. 4A, in a second embodiment of the present invention, when a double verify method is performed, a bit line is first precharged. During a bit line precharge period T1, the bit line select signal BSL having a first voltage (V1) level is input to the gate of the first NMOS transistor N1 of the page buffer 121. Thus, the bit line is precharged (V1-Vt).

After the bit line is precharged, a second verify voltage PV2 is applied to a selected word line during a first evaluation period T2, thus evaluating a change in the bit line voltage. The second verify voltage PV2 can be set to a verify voltage level when a double verify method is performed using the method of the second embodiment. The verify voltage level is able to distinguish the first to third memory cell groups through the first and second verify operations.

The operation of evaluating the voltage of the bit line is identical to that of the first embodiment, and a detailed description thereof is omitted.

After the first evaluation period T2, a first sensing period T3 for sensing a change in the bit line voltage is provided. During the first sensing period T3, the bit line select signal BSL having a second voltage (V2) level is applied to the gate of the first NMOS transistor N1. An operation during the first sensing period T3 is also identical to that of the first embodiment. During the first sensing period T3, the third memory cell group can be distinguished from the first and second memory cell groups.

A second verify operation is performed immediately after the first sensing period T3. For the second verify operation, the bit line select signal BSL having the second voltage (V2) level changes to a fourth voltage (V4) level and is then input. The second verify voltage is applied to a selected word line like the first verify operation. When the bit line select signal BSL having the fourth voltage (V4) level is applied to the gate of the first NMOS transistor N1, if voltage of the bit line is higher than a fifth voltage (V4-Vt), the first NMOS transistor N1 remains turned-off. However, if voltage of the bit line is lower than the fifth voltage (V4-Vt), the first NMOS transistor N1 is turned on.

Accordingly, the fourth voltage V4 is determined according to an amount which a bit line voltage is discharged during the first evaluation period T2. Thus, the fifth voltage (V4-Vt), which is lower than the fourth voltage V4 as much as the threshold voltage Vt of the first NMOS transistor N1, is set to a voltage level capable of distinguishing the first memory cell group and the second memory cell group.

In other words, after the first evaluation period T2, the bit line voltage of the first memory cell group should be higher than the fifth voltage (V4-Vt), and the bit line voltage of the second memory cell group should be lower than the fifth voltage (V4-Vt). Accordingly, the fourth voltage V4 is set to meet the above condition.

Figure 4B:
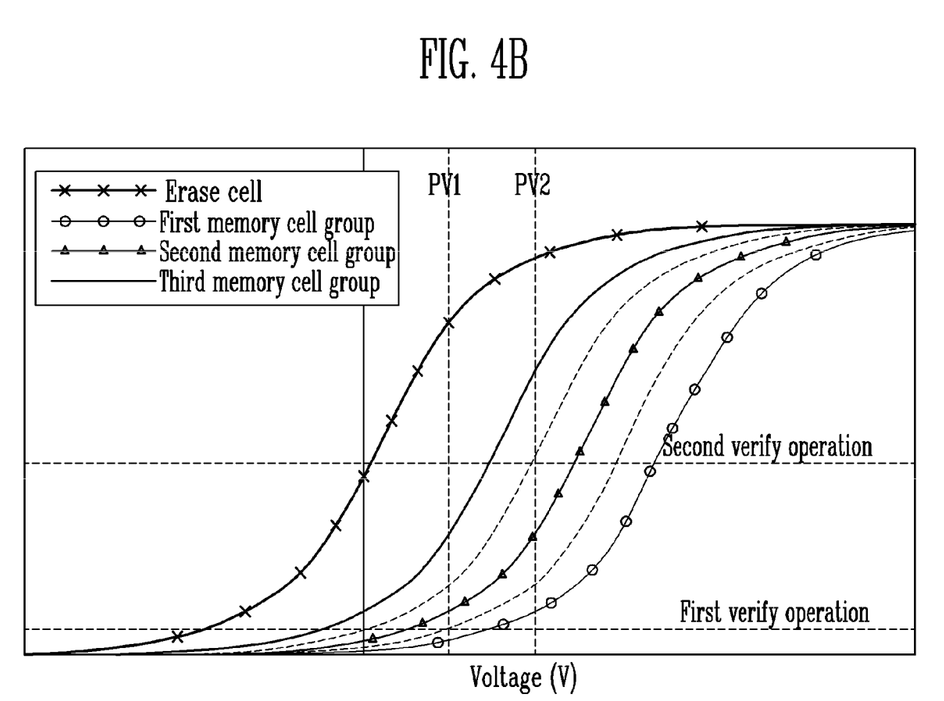
FIG. 4B shows threshold voltage distributions of memory cells when the double verify method of FIG. 4A is performed.

FIG. 4B shows threshold voltage distributions of memory cells when the double verify method of FIG. 4A is performed.

From FIG. 4B, the third memory cell group can be distinguished by performing the first and second verify operations at the first verify voltage PV1, and the second memory cell group can be distinguished.

Figure 5:
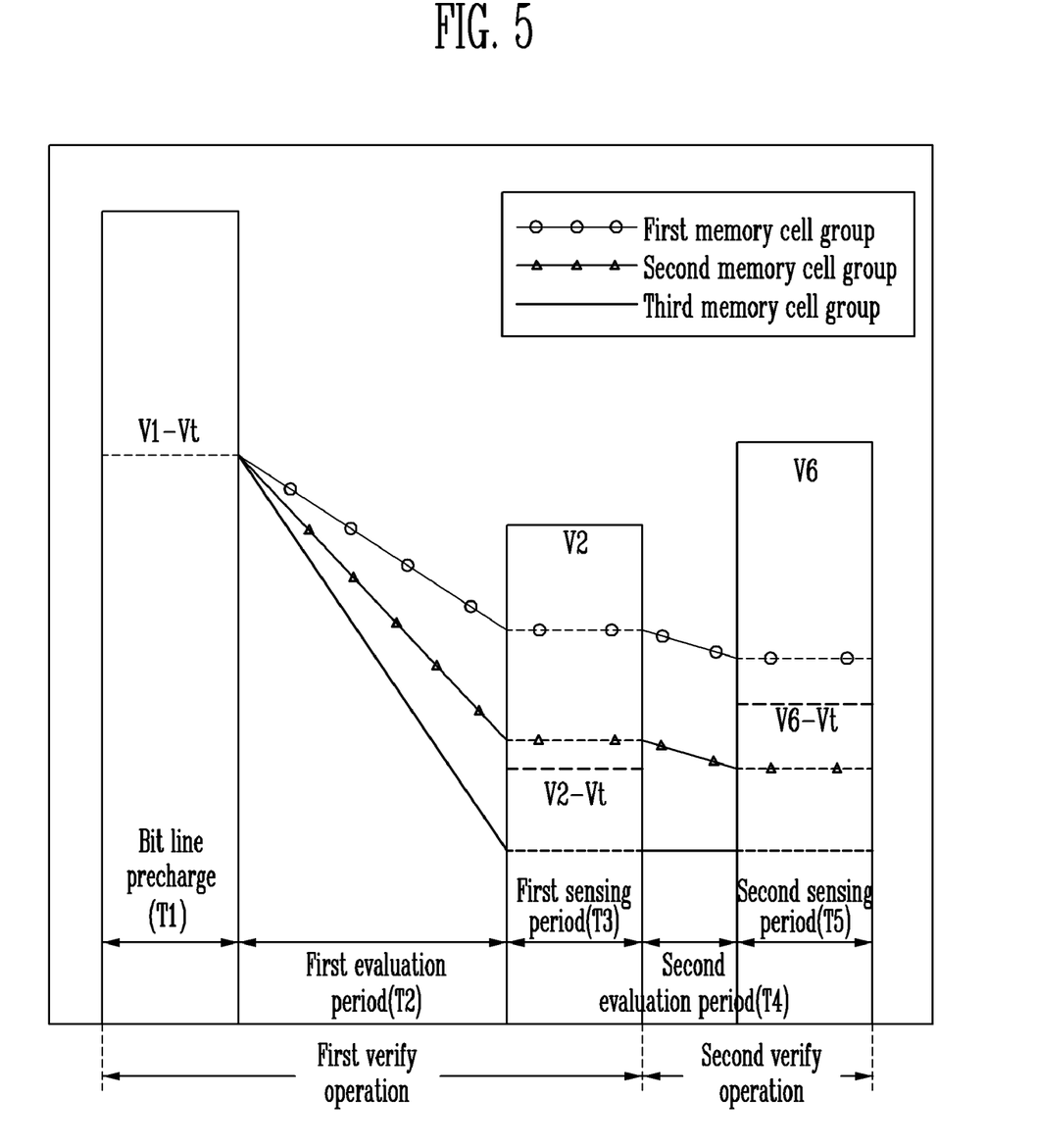
FIG. 5 is an operation timing diagram showing a double verify method according to a third embodiment of the present invention.

FIG. 5 is an operation timing diagram showing a double verify method according to a third embodiment of the present invention.

Referring to FIG. 5, in a third embodiment of the present invention, a bit line is first precharged when a double verify method is performed. During a bit line precharge period T1, the bit line select signal BSL having a first voltage (V1) level is applied to the gate of the first NMOS transistor N1 of the page buffer 121. Accordingly, the bit line is precharged (V1-Vt).

After the bit line is precharged, a second verify voltage PV2 is applied to a selected word line during a first evaluation period T2 in order to evaluate a change in the bit line voltage. The second verify voltage PV2 can be set to a verify voltage level, which is capable of distinguishing the first to third memory cell groups through first and second verify operations, when a double verify method employing the method of the second embodiment is performed. The operation of evaluating the voltage of the bit line is identical to that of the first and second embodiments, and a detailed description thereof is omitted.

After the first evaluation period T2, a first sensing period T3 for sensing a change in the bit line voltage is provided. During the first sensing period T3, the bit line select signal BSL having a second voltage (V2) level is applied to the gate of the first NMOS transistor N1. An operation during the first sensing period T3 is also identical to that of the first embodiment. During the first sensing period T3, the third memory cell group can be distinguished from the first and second memory cell groups.

Subsequent to the first sensing period T3, when the bit line is floated by turning off the first NMOS transistor N1, the voltage of the bit line is changed again during a second evaluation period T4. The second verify voltage PV2, having the same voltage level as that during the first evaluation period T2, is applied to a selected word line.

After the second evaluation is completed, for the second verify operation, the bit line select signal BSL having the second voltage (V2) level changes to a sixth voltage (V6) level and is then input. When the bit line select signal BSL having the sixth voltage (V6) level is applied to the gate of the first NMOS transistor N1, if the voltage of the bit line is higher than a seventh voltage (V6-Vt), the first NMOS transistor N1 remains turned-off. However, if voltage of the bit line is lower than the seventh voltage (V6-Vt), the first NMOS transistor N1 is turned on. The sixth voltage V6 is set accordingly.

As described above, in accordance with the method of verifying programming of a nonvolatile memory device according to the present invention, a bit line is precharged only once when a program verify operation is performed twice. Accordingly, the program verify time can be shortened.

The embodiments disclosed herein have been proposed to allow a person skilled in the art to easily implement the present invention, and the person skilled in the art may implement the present invention by a combination of these embodiments. Therefore, the scope of the present invention is not limited by or to the embodiments as described above, and should be construed to be defined only by the appended claims and their equivalents.

What is claimed is:

1. A method of verifying programming of a selected memory cell of a nonvolatile memory device, the method comprising:
    precharging a bit line;
    a first sensing step of applying a first verify voltage to a word line of the selected memory cell, performing a first read evaluation operation for changing a voltage of the bit line, and sensing results of the first read evaluation operation using a first sensing voltage; and
    a second sensing step of, after the first sensing step, performing a second read evaluation operation for changing the voltage of the bit line, and sensing results of the second read evaluation operation using the first sensing voltage.

2. The method of claim 1, wherein a pass voltage is applied to the remaining word lines other than the word line of the selected memory cell.

3. The method of claim 1, wherein in the second read evaluation operation, the first verify voltage is applied to the word line of the selected memory cell.

4. The method of claim 1, further comprising:
    setting a step voltage of a program voltage to a first step voltage with respect to memory cells which are sensed as program fail in the first sensing step.

5. The method of claim 1, further comprising:
    setting a step voltage of a program voltage to a second step voltage with respect to memory cells which are sensed as program pass in the first sensing step and sensed as program fail in the second sensing step.

6. The method of claim 1, further comprising:
    setting a step voltage of a program voltage to a first step voltage with respect to memory cells which are sensed as program fail in the first sensing step, wherein the first step voltage is higher than a current program step voltage, and
    setting a step voltage of a program voltage to a second step voltage with respect to memory cells which are sensed as program pass in the first sensing step and sensed as program fail in the second sensing step, wherein the second step voltage is lower than the current program step voltage.

7. A method of verifying programming of a selected memory cell of a nonvolatile memory device, the method comprising:
    precharging a bit line;
    applying a first verify voltage to a word line of the selected memory cell and performing a read evaluation operation for changing a voltage of the bit line; and
    sensing results of the read evaluation operation using a first sensing voltage and a second sensing voltage.

8. The method of claim 7, further comprising:
    applying a pass voltage to the remaining word lines other than the word line of the selected memory cell.

9. The method of claim 7, further comprising:
    setting a step voltage of a program voltage to a first step voltage with respect to memory cells which are sensed as program fail as a result of the sensing using the first sensing voltage.

10. The method of claim 7, further comprising:
    setting a step voltage of a program voltage to a second step voltage with respect to memory cells which are sensed as program pass as a result of the sensing using the first sensing voltage and sensed as program fail as a result of the sensing using the second sensing voltage.

11. The method of claim 7, further comprising:
    setting a step voltage of a program voltage to a first step voltage with respect to memory cells which are sensed as program fail as a result of the sensing using the first sensing voltage, wherein the first step voltage is higher than a current program step voltage, and
    setting a step voltage of a program voltage to a second step voltage with respect to memory cells which are sensed as program pass as a result of the sensing using the first sensing voltage and sensed as program fail as a result of the sensing using the second sensing voltage, wherein the second step voltage is lower than the current program step voltage.

12. The method of claim 7, wherein the sensing of the results of the read evaluation operation using the first and second sensing voltages comprises:
- a first sensing step of sensing the results of the read evaluation operation using the first sensing voltage; and
- a second sensing step of performing a second read evaluation operation for changing the voltage of the bit line, and sensing results of the second read evaluation operation using the second sensing voltage.

13. A method of verifying programming of a nonvolatile memory device, the method comprising:
- precharging a bit line;
- applying a first verify voltage to a word line of a selected memory cell;
- performing a first read evaluation operation for changing a voltage of the bit line;
- first sensing results of the first read evaluation operation using a first sensing voltage;
- performing a second read evaluation operation for changing the voltage of the bit line; and
- second sensing results of the second read evaluation operation using the first sensing voltage.

14. The method of claim 13, further comprising:
applying a pass voltage to the remaining word lines other than the word line of the selected memory cell.

15. The method of claim 13, wherein in the second read evaluation operation, the first verify voltage is applied to the word line of the selected memory cell.

16. The method of claim 13, further comprising:
setting a step voltage of a program voltage to a first step voltage with respect to memory cells which are sensed as program fail in the first sensing step.

17. The method of claim 13, further comprising:
setting a step voltage of a program voltage to a second step voltage with respect to memory cells which are sensed as program pass in the first sensing step and sensed as program fail in the second sensing step.

18. The method of claim 13, further comprising:
setting a step voltage of a program voltage to a first step voltage with respect to memory cells which are sensed as program fail in the first sensing step, wherein the first step voltage is higher than a current program step voltage, and
setting a step voltage of a program voltage to a second step voltage with respect to memory cells which are sensed as program pass in the first sensing step and sensed as program fail in the second sensing step, wherein the second step voltage is lower than the current program step voltage.

* * * * *